US006175489B1

(12) United States Patent
Markow et al.

(10) Patent No.: US 6,175,489 B1
(45) Date of Patent: Jan. 16, 2001

(54) ONBOARD SPEAKER SYSTEM FOR PORTABLE COMPUTERS WHICH MAXIMIZES BROAD SPATIAL IMPRESSION

(75) Inventors: Mitchell A. Markow, Spring; David E. Gough, Houston; Jeremy Ford, Spring, all of TX (US)

(73) Assignee: Compaq Computer Corporation, Houston, TX (US)

( * ) Notice: Under 35 U.S.C. 154(b), the term of this patent shall be extended for 0 days.

(21) Appl. No.: 09/090,689

(22) Filed: Jun. 4, 1998

(51) Int. Cl.[7] .......... H05K 5/00; A47B 81/00; H04R 1/02

(52) U.S. Cl. .......... 361/683; 361/683; 312/223.1; 381/300; 381/303; 381/304; 381/305; 381/306; 381/307; 381/332; 381/333; 381/386; 381/388; 381/87

(58) Field of Search .......... 381/300, 303, 381/304, 305, 306, 307, 332, 333, 386, 388, 309, 87; D14/113, 114; 361/683, 686; 312/223.1

(56) References Cited

U.S. PATENT DOCUMENTS 5,027,403 * 6/1991 Short et al. .......... 381/24
5,588,063 * 12/1996 Edgar .......... 381/24
5,668,882 * 9/1997 Hickman et al. .......... 381/24
5,675,426 * 10/1997 Meisner et al. .......... 358/838
5,687,592 * 11/1997 Penniman et al. .......... 70/14
5,764,777 * 6/1998 Goldfarb .......... 381/27
5,838,537 * 11/1998 Lundgren et al. .......... 361/683
5,898,137 * 4/1999 Saito .......... 181/144
6,011,686 * 1/2000 Grasso et al. .......... 361/686
6,040,978 * 3/2000 Spencer .......... 361/683

OTHER PUBLICATIONS

Dimitriadis et al., "Piezoelectric Actuators for Distributed Vibration Excitation of Thin Plates", Journal of Vibration and Acoustics, vol. 113, Jan., 1991, pp. 100–107.
Sonti et al., "Equivalent Forces and Wavenumber Spectra of Shaped Piezoelectric Actuators," Journal of Sound and Vibration 187, 1995, pp. 111–130.
Komiyama et al., "Distance Control of Sound Images by a Two–dimensional Loudspeaker Array", Journal of Acoustic Society, Japan, 13, 1992, pp. 171–180.
Bose 901 Direct/Reflecting® Speaker Technology, Acoustic Waveguide Technology, BOSE 1997.
"Quickpack Piezoelectric Actuators", ACX(Active Control Experts), Nov. 1996, 12 pages.

* cited by examiner

*Primary Examiner*—Leo P. Picard
*Assistant Examiner*—Tung Minh Bui
(74) *Attorney, Agent, or Firm*—Conley, Rose & Tayon, P.C.

(57) ABSTRACT

A stereo speaker system for portable computers which maximizes spatial impression by using rearward-firing speakers, mounted in the back of the display, in combination with forward-firing speakers mounted on the chassis or in the front side of the display.

37 Claims, 4 Drawing Sheets

ONBOARD SPEAKER SYSTEM FOR PORTABLE COMPUTERS WHICH MAXIMIZES BROAD SPATIAL IMPRESSION

BACKGROUND AND SUMMARY OF THE INVENTION

This application is related to portable computer speaker systems.

Background

Computer-Based Audio

The production of quality sound with computers has advanced significantly in recent years. Early personal computers typically had nothing more than a single, small speaker used to produce a beep or series of single-frequency beeps to indicate system status upon startup. However, consumers demanded more. With the significant advances in circuit miniaturization, improved sound quality electronics has been available for desktop systems for some time, and is now moving into the portable computer systems arena.

Today, there is a multimedia explosion that is adding a significant new dimension to the way people use computers. One of the biggest advantages is 16-bit, CD-quality sound. With the right speakers, this sound can be as impressive as the sound on a normal consumer's stereo system. More and more, computer applications include the capability to use and capture the full impact of 16-bit sound for multimedia. MIDI musical compositions become more inspiring, games more suspenseful, software more dramatic, and radio and television programs (obtained through the computer) can equal the quality of conventional reception systems.

In addition, computer and audio technologies are revolutionizing business. For example, in video conferencing, voices are reproduced with a natural quality that makes them seem as if the speaker were in the room. Providing a high-quality audio background during presentations greatly enhances their effectiveness, and portable computers provide the greatest opportunity for meeting this need. Furthermore, the work environment is becoming ever more mobile with employees traveling more, and perhaps even telecommuting (working from home). Use of increased travel time translates to work environments with higher ambient noise, such as airports, trains, or mass transit systems. Another factor in this trend is the user's need for more effective methods for communicating with potential customers, or even with the office when away on business.

Background

Spatial Impression

The design of sound reproduction systems is not only based on considerations of electrical and acoustical engineering and physics, but also requires knowledge of psychoacoustics, i.e. how sound is perceived by listeners.

One of the parameters of psychoacoustics is spatial impression. When a sound is generated in a room, the listener will first hear the sound via the direct path from the source. Shortly thereafter, the listener will hear the reflections of the sound off surfaces such as walls or ceilings. Human listeners will assess the size of the space they are in by listening to laterally reflected sound which accompanies a sound signal. Thus, in a loudspeaker system it is desirable to have some sound transmission paths which reach the ears of the listener with a certain amount of delay (e.g. 10–60 milliseconds) as compared with the direct transmission path. (This will give the impression of a spacious listening room by broadening the soundstage, and also by giving the illusion of pushing the sound beyond the physical location of the speakers, even if the listener is listening in a room which is very small.) Moreover, another peculiarity of this psychoacoustic parameter is that the low frequencies (below 500 Hz) dominate spatial impression. A more roomy spatial impression is welcome to many listeners. However, it is not easy to do this with a small speaker system, and particularly not with a small portable computer's speaker system.

To increase spatial impression, the ratio of laterally reflected energy to directly transmitted energy can be increased: the higher this ratio, the greater the spatial impression. (An extreme case of this is found in a symphony concert hall, where there is almost no direct sound.)

Whether the user is video-conferencing, playing a game, or just working with music in the background, spatial impression plays an important role in the computing experience. That role is growing ever more important as multimedia makes its way into even the most uncompromising of business applications.

Further background regarding spatial impression can be found in: J. Blauert, SPATIAL HEARING (2.ed. 1996); and in M. Barron, "Effects of Early Reflections on Subjective Acoustic Quality in Concert Halls" (thesis, University of Southampton, 1974); both of which are hereby incorporated by reference.

Background

Stereophonic and Surround Sound

Since its introduction in the 1950's, stereo has been regarded as an essential minimum requirement of quality sound reproduction. Stereo can convey a traditional soundstage in which the sound comes from the front, such as when one attends a play or concert. However, even stereo has shortcomings when required to convey the ambiance where the sound is heard from all around the listener. Stereo's lack of spatiality undermines sonic realism in, for example, a game where aircraft fly overhead from front to back, or footsteps come from off to the side. For this reason various "surround sound" schemes have been used, to provide at least some speaker output behind the listeners' positions.

Background

Portable Computer Audio Limitations

Two driving constraints on the development of portable computers are volume and power consumption. The form factor of portable computers cannot be expanded, so that volume is a key resource. Additional functions are continually sought to be added, and many of these place new demands on available volume. Moreover, as larger display sizes become available they require more area in the lid, and hence consume more volume. Similarly, users continually demand more battery lifetime, which implies a continuous struggle to minimize power consumption.

These two constraints bind especially tightly in the case of speakers: the low-frequency power-efficiency of a speaker is directly affected by its volume. Since low-frequency response is a significant limitation of portable speaker systems, this is a difficult constraint. Some attempts have been made to use external speakers with portable computers, but this is cumbersome.

As of 1997, the internal sound systems typically sold with portable computers produce marginal sound quality at best.

Most multimedia computers sold today include a stereo sound card which is capable of reasonably good sound reproduction. However, the internal speakers are typically small and produce tinny sound with inadequate bass. As a result, millions of multimedia computer users suffer very poor sound fidelity from their computers.

However, poor sound quality in portable computers is undesirable. The experience of a game or multimedia presentation, with sound and video animation, can be astonishingly real when coupled with quality audio. Quality sound can make a significant difference in the enjoyment the user can get from a multimedia computer. Music while working is more enjoyable, training and "edutainment" titles are richer, and games become much more realistic and exciting.

Onboard Speaker System for Portable Computers which Maximizes Broad Spatial Impression The present application discloses portable computers with improved spatial impression. This is realized by installing rearward-firing transducers in the plastic housing of a portable computer. The sound from these transducers reflects off external surfaces which may be present, to help provide the delayed lateral reflections which enhance spatial impression. In one class of embodiments, two small speakers (tweeters) are added in the front of the display, to make voice localization more natural.

The spatial impression of the resultant sound is significantly enhanced by the back radiation from the rearward-firing speakers. The direct sound path provides sound localization, while the back radiation provides sound ambience. Moreover, the rearward-firing speakers also increase the apparent front-back depth of the acoustic image. An advantage is that no external speakers are required to provide the level of spatial enhancement provided by this disclosed embodiment. A further advantage is that, depending on the surrounding surfaces, the additional reflections from the rearward-firing speakers may help to provide a surround sound impression.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Speaker Layout in a Portable Computer

Figure 1:
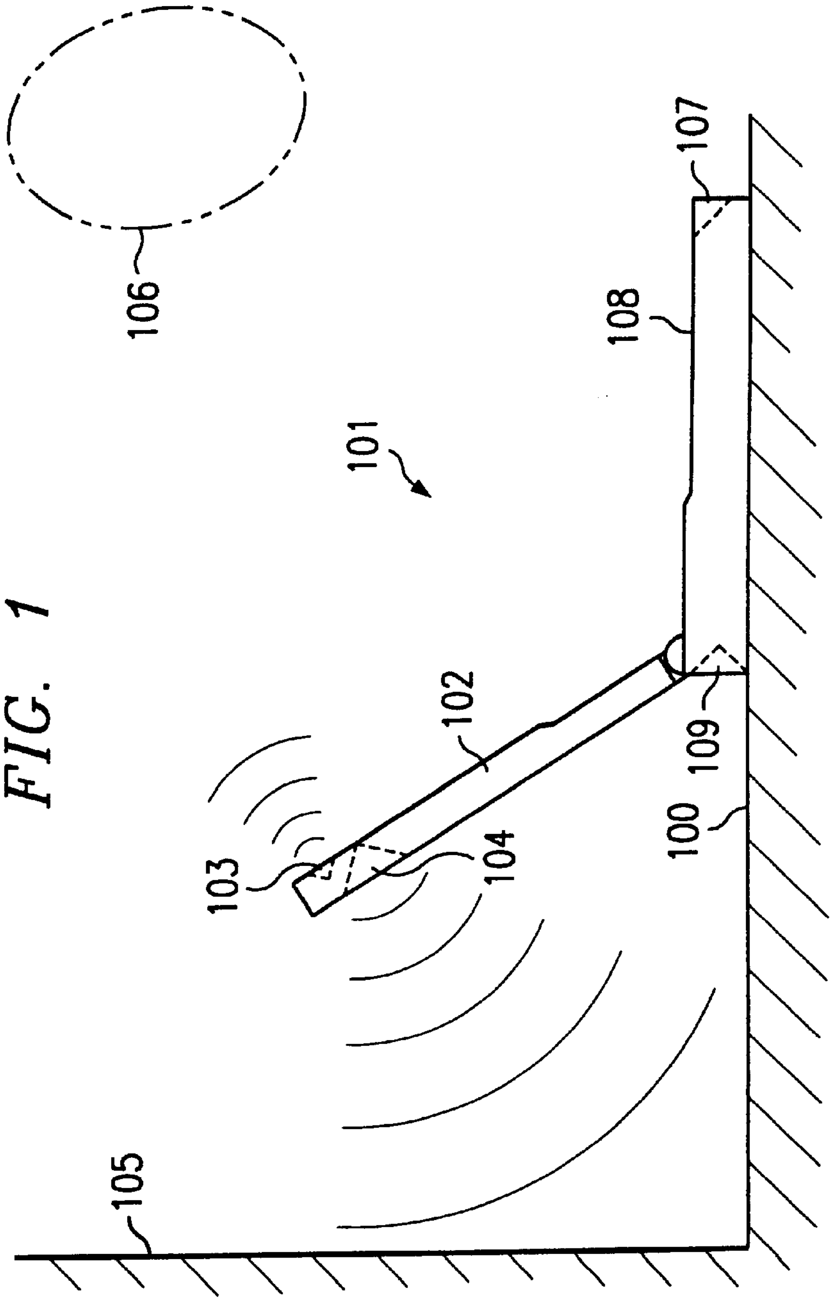
FIG. 1 shows a diagram of a portable computer in the preferred embodiment.

FIG. 1 shows a diagram of a portable computer in the preferred embodiment. A portable computer 101 is positioned on a surface 100 with display 102 in proper viewing position, and comprising two sets of speakers. A pair of speakers 104 is mounted in the back of the display 102 for back-firing sound onto reflective surfaces 105 and 100 back to the volume 106 where the listener may be located. The speakers 104 need not be at the corners, but may also be located anywhere in the back of the display lid that provides the desired result. Optionally, a second pair of speakers 103 may be mounted on the forward-facing side of the display 102 to assist with mono localization, and provide a direct sound path to the listener located in the volume 106 seated in front of the computer 101. Alternatively, the forward-firing speakers may be mounted on the front of the chassis 108 of the computer 101 at location 107, and/or the rear-firing speakers may be mounted in the rear of the chassis 108 at location 109. The angle of the speakers as mounted in the display lid 102 should preferably be divergent: this helps to direct sound in different paths in the horizontal plane to obtain separate wall and surface reflections.

Filtering

It is also preferable to filter the signal applied to the rearward-firing speakers. Preferably this audio signal is low-pass filtered with an upper corner frequency (−3 dB point) which is less than 2000 Hz, and more preferably less than 500 Hz. This is done because the spatial impression effects are mostly dependent on frequencies below about 500 Hz, whereas too much acoustical energy in the mid-band range (of approximately 800–2000 Hz) may shift the acoustic image too far back from the listener.

In the presently preferred embodiment, a five-pole filter function is implemented, to provide low-pass filtering of the left and right channels of a stereo signal to two rear speakers respectively. The preferred filter function uses a −3 dB corner frequency of about 500 Hz, but of course other corner frequencies can be used instead.

Directionality

Optionally the directionality of the speaker pattern (i.e. the angle of the acoustic emission) can also be varied. For example, a polar pattern with a narrower non-voiceband emission causes less image shift.

Reflected Sound Path

Figure 2:
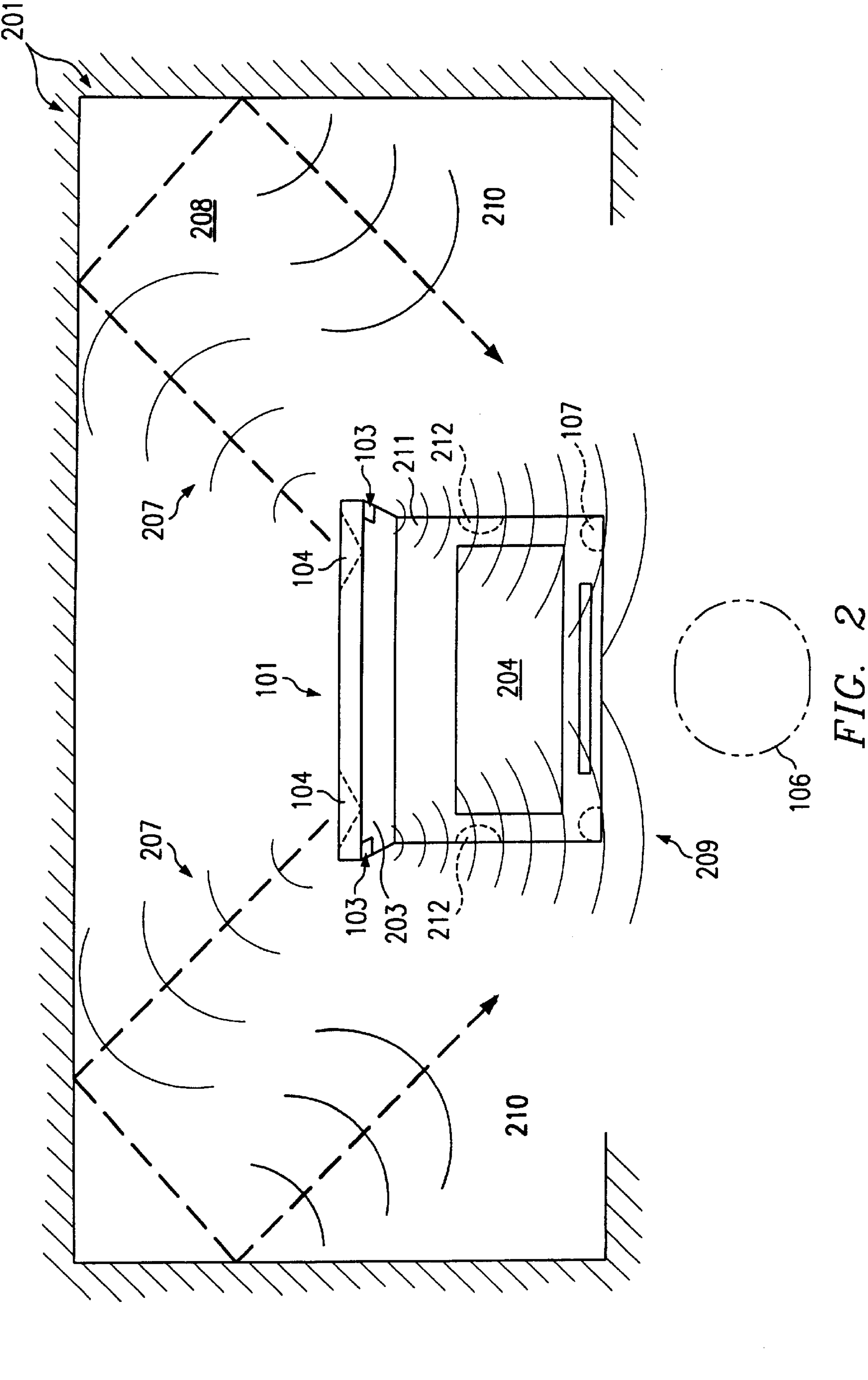
FIG. 2 shows a top-down view of reflected sound from a speaker system mounted into the display of a portable computer.

FIG. 2 shows a top-down view of reflected sound path from a speaker system mounted in the display lid of a portable computer. The computer is positioned on a surface 208 with display lid 203 open for viewing by the listener. When a listener is seated approximately in front of the computer 101, for use of the computer keyboard 204 and display 203, the listener's head can be expected to be located in the volume 106. Speakers 104 mounted on the back of the display 203 provide rear-firing sound waves 207 which are reflected (in this example) off of vertical surfaces 201 and horizontal surface 208, back to the listener. (The surfaces 201 and 208 are part of the user's work environment, so their position is not known a priori.) Optionally, speakers 103 mounted on the front of the display 203 provide direct-path audio to the listener. The front-mounted speakers improve sound quality, but add cost. The combination of the reflected sound waves 210 and the direct sound waves 209 provides improved spatial impression to the listener.

Alternatively, the forward-firing speakers 103 may be mounted in a front location 107 of the chassis 211 of the computer 101.

In a further alternative, speakers may be mounted at a side location 212, instead of or in addition to the rear-firing speakers to enhance lateral reflections.

Monitor-Mounted Desktop Embodiment

In a fuirther class of embodiments, the sound path innovations of the above portable computer embodiments are applied to desktop computers. A key factor in the desktop environment is that the user's head position is predictable in relation to the monitor (though not in relation to the chassis otherwise).

It is quite common nowadays for computer manufacturers to provide speakers which attach on either side of the monitor. This design offers a better alternative to speakers that, for example, are detached and positioned in any convenient location (and usually counterproductive for producing high fidelity sound quality). The monitor-mounted speakers are more closely associated with the horizontal plane of the listener, and therefore can offer greater sound quality.

Figure 4:
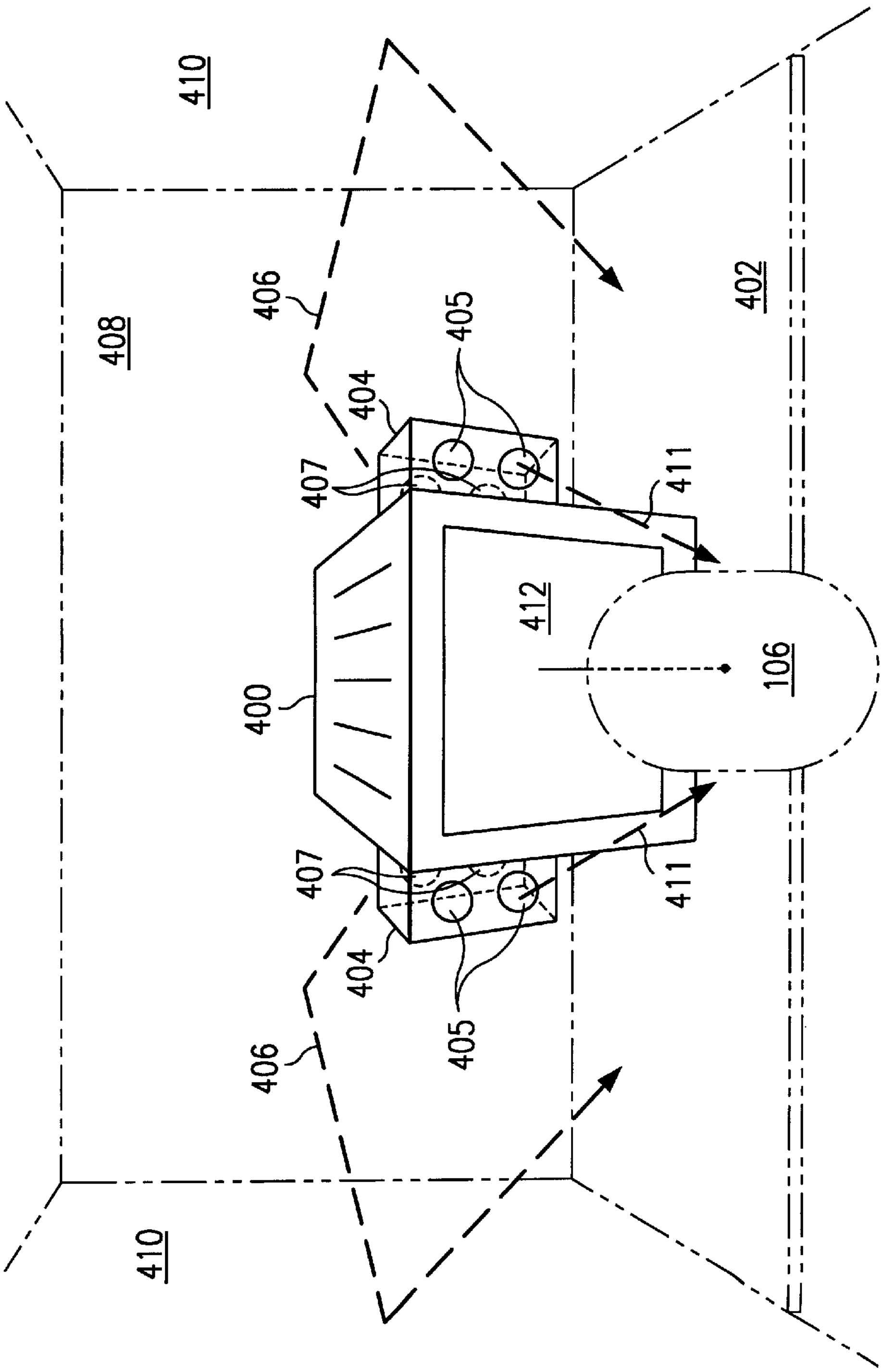
FIG. 4 shows an alternative embodiment where the speakers are attached to the computer monitor.

FIG. 4 shows an alternative embodiment where the speakers are attached to the computer monitor. A computer monitor 400, for example, is positioned on a surface (e.g. desktop) 402. A pair of speakers 404 are attached to either side and towards the front of the monitor 400. In this embodiment each of the speakers 404 includes both a forward-firing driver 405 and a rear-firing driver 407. When the computer is in use, the listener's head 106 will typically be positioned a distance 412 of approximately 1–2 feet in front of the monitor. The rear-firing speakers 407 direct acoustical energy 406 away from a listener 106. Some of this energy will typically be reflected off of ambient surfaces (in this example, 408 and 410) back to the listener. The front-firing speakers 405 provide a direct sound path to the listener 106. The ratio of the delay in time of the reflected sound 406 to the direct path sound 411 defines the amount of spatial impression. The greater the ratio, the greater the increase in spatial impression perceived by the listener 106.

Portable Computer System

Figure 3:
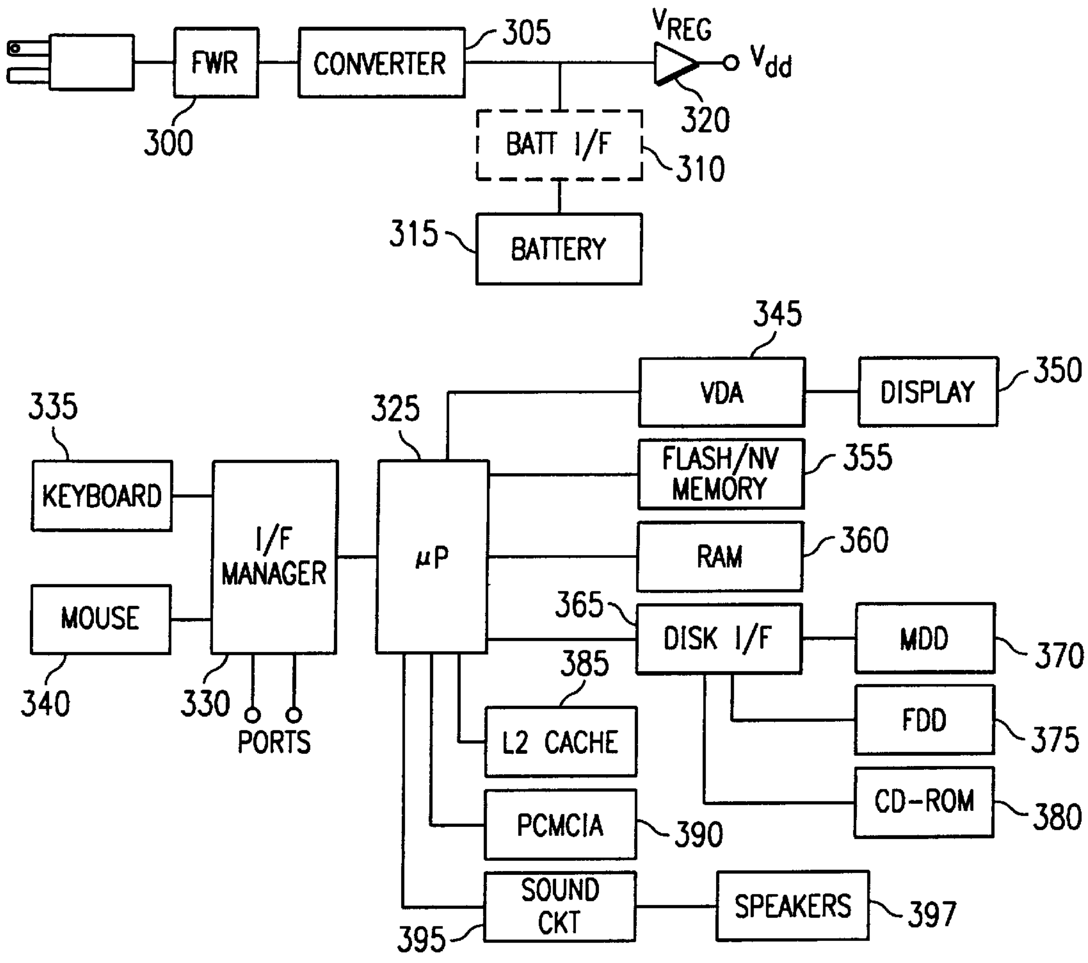
FIG. 3 shows a block diagram of a portable computer system according to the presently preferred embodiment.

FIG. 3 shows a block diagram of a portable computer system according to the presently preferred embodiment. The system includes a power converter 305 which is used to charge a battery 315. Optionally, a battery interface 310 is interposed between the battery and the rest of the circuitry. The power converter 305 is connected, through a full-wave bridge rectifier, 300, to draw power from AC mains, and is connected to provide a DC voltage to the battery 315. The battery 315 (or the converter 305), connected through a voltage regulator 320, is able to power the complete portable computer system, which includes in this example:

user input devices (e.g. keyboard 335 and mouse 340);

at least one microprocessor 325 which is operatively connected to receive inputs from said input device, through an interface manager chip 330 (which also provides an interface to the various ports);

a memory (e.g. flash or non-volatile memory 355 and RAM 360), which is accessible by the microprocessor;

a data output device (e.g. display 350 and video display adapter card 345) which is connected to output data generated by the microprocessor 325;

a magnetic disk drive 370 which is read-write accessible, through an interface unit 365, by the microprocessor 325: and a sound system comprising a sound circuit 395 driving a speaker system 397.

Optionally, of course, many other components can be included, and this configuration is not definitive by any means. For example, the portable computer may also include a CD-ROM drive 380 and floppy disk drive ("FDD") 375 which may interface to the disk interface controller 365. Additionally, L2 cache 385 may be added to speed data access from the disk drives to the microprocessor, and a PCMCIA 390 slot accommodates peripheral enhancements.

Alternative Embodiment

Side-Firing Speakers

According to a disclosed class of innovative embodiments, the innovative methods are not restricted to rear-firing speakers, but may also be realized with side-firing speakers (see FIG. 2, reference 212) to enhance lateral reflections. In various alternative embodiments, such side-firing speakers can be used instead of or in addition to the rear-firing speakers of the preferred embodiment.

Alternative Embodiment

Spectrum Customization

According to a disclosed class of innovative embodiments, the innovative method can be implemented to customize spatial impression for the occasion. For example, if making presentations to an audience, the user may desire to use only the rear-firing speakers, and cut-off the forward-firing speakers. On the other hand, the user may desire to cut-off the rear-firing speakers in a more quiet environment.

Alternative Embodiment

Time Delay

According to a further disclosed class of innovative embodiments, a time delay is introduced into the acoustic signal which is used to drive the rear-firing and/or side-firing speakers. In this class of embodiments, the time difference between the rear-firing and forward-firing speakers increases the spatial impression.

According to a disclosed class of innovative embodiments, there is provided: A portable computer system, comprising: an input device, a microprocessor which is operatively connected to detect inputs from said input device, random-access memory which is connected to be read/write accessible by said microprocessor, an output device operatively connected to receive outputs from said microprocessor, and a display rotatably attached to said portable computer to display information to a user; a plurality of first speakers which radiate acoustic energy toward a user position in the front of said display; and a plurality of second speakers which radiate acoustic energy in a predominant direction greater than 60 degrees away from the direction of said first speakers.

According to another disclosed class of innovative embodiments, there is provided: A portable computer system, comprising: a user input device, a microprocessor which is operatively connected to detect inputs from said input device, random-access memory which is connected to be read/write accessible by said microprocessor, and an output device operatively connected to receive outputs from said microprocessor; a movable display, operatively connected to display data generated by said microprocessor; a plurality of forward-firing speakers which radiate acoustic energy toward a user position in front of said display; and one or more rearward-firing speakers, which radiate acoustic energy toward the rear of said display; wherein the spectral content of said acoustic energy from said rearward-firing speakers is low-pass filtered with a cutoff frequency below 1000 Hz, in order to enhance spatial impression.

According to another disclosed class of innovative embodiments, there is provided: A method of enhancing spatial impression in a portable computer audio sound system, comprising the steps of: (a.) driving first speakers, which are integral with said computer, to radiate acoustic energy toward a user position in front of a planar display; and (b.) driving second speakers, which are integral with said computer, to radiate acoustic energy in a redominant direction more than 90 degrees away from the direction of said first speakers; whereby spatial impression of said computer sound system is enhanced.

According to another disclosed class of innovative embodiments, there is provided: A method of enhancing spatial impression in a portable computer audio sound system, comprising the steps of: (a.) driving a plurality of forward-firing speakers, which are integral with said computer, to radiate acoustic energy toward a user position in front of a planar display; and (b.) driving at least one rearward-firing speaker, which is integral with said computer, to radiate acoustic energy in a predominant direction more than 60 degrees away from the direction of said first speakers; wherein the spectral content of said acoustic energy from said rearward-firing speakers is predominantly below a certain frequency in order to enhance spatial impression.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

For example, the disclosed concepts can also be used with audio system configurations which use more than two channels of audio source signal.

In one alternative embodiment, the user is allowed to change the filtering on the back speakers, for use during presentations, so that the back speakers radiate a relatively flat equalized spectrum, rather than low pass-filtering them to emphasize the frequencies which enhance spatial impression.

In another alternative embodiment, the user has the option to cut off power to the back speakers, for situations (such as meetings) where minimal disturbance of others is desired.

It should also be noted that the disclosed innovative ideas are not limited only to the disclosed number of speakers, but may include more speakers.

It should also be noted that the disclosed innovative ideas are not limited to positioning the speakers at the top of the display, but can also be implemented with front-firing and/or rear-firing speakers which are not mounted in the lid. One example of this, though not the only one, is to mount the front-firing and/or rear-firing speakers in the main body of the computer.

It should also be noted that the disclosed innovative ideas are not limited to separate speaker encasements, but may also comprise speaker designs where the forward-firing and rear-firing speakers are combined into one enclosure in the display panel, as long as the approximate phase relationship can be maintained.

It should also be noted that the disclosed innovative ideas are applicable to a docking station environment, where external speakers are driven instead of (or in addition to) the built-in speakers in the portable computer.

What is claimed is:

1. A portable computer system, comprising:

a case having first and second parts which are rotatably attached to each other, said first part at least partially enclosing an input device, a microprocessor which is operatively connected to detect inputs from said input device, random-access memory which is connected to be read/write accessible by said microprocessor, and an output device operatively connected to receive outputs from said microprocessor, said second part containing a display to display information to a user;

a plurality of first speakers, at least partially enclosed by said case, which radiate acoustic energy toward a user position in the front of said display;

a plurality of second speakers, at least partially enclosed by said case, which radiate acoustic energy in a predominant direction greater than 60 degrees away from the direction of said first speakers;

a sound circuit coupled to said microprocessor and said pluralities of first and second speakers and drives said first and second speakers with acoustical signals, said sound circuit introducing a time delay in the acoustical signal provided to the plurality of second speakers with respect to the plurality of first speakers.

2. The system of claim 1, wherein said first speakers are located in the front side of said display.

3. The system of claim 1, wherein said first speakers are located near the front of a chassis of said computer.

4. The system of claim 1, wherein said second speakers are located in the back of said display.

5. The system of claim 1, wherein said second speakers are located in the back of a chassis of said computer.

6. The system of claim 1, wherein said second speakers are mounted in a side location of a chassis of said computer.

7. The system of claim 1, wherein said first speakers work in combination with said second speakers to enhance said spatial impression.

8. The system of claim 1, wherein equalization is provided to said first speakers to lower the point of low-end roll-off.

9. The system of claim 1, wherein said second speakers radiate an acoustic signal which is delayed in time with respect to energy radiated from said first speakers.

10. The system of claim 1, wherein the spectral content of said acoustic energy radiated by said second speakers is predominantly below a certain frequency in order to enhance spatial impression.

11. The system of claim 1, wherein said first and second speakers are dynamic speakers.

12. The system of claim 1, wherein said first and second speakers are attached to a monitor external to said portable computer, and positioned to optimize spatial impression.

13. A portable computer system, comprising:

a case having first and second parts which are rotatably attached to each other, said first part at least partially enclosing an input device, a microprocessor which is operatively connected to detect inputs from said input device, random-access memory which is connected to be read/write accessible by said microprocessor, and an output device operatively connected to receive outputs from said microprocessor, said second part containing a display to display information to a user;

a plurality of first speakers, at least partially enclosed by said case, which radiate acoustic energy toward a user position in the front of said display; and a plurality of second speakers, at least partially enclosed by said case, which radiate acoustic energy in a predominant direction greater than 60 degrees away from the direction of said first speakers;

a sound circuit that permits said first speakers and said second speakers to be selectively disabled to match the environment.

14. A portable computer system, comprising:

a user input device, a microprocessor which is operatively connected to detect inputs from said input device, random-access memory which is connected to be read/write accessible by said microprocessor, and an output device operatively connected to receive outputs from said microprocessor;

a movable display, operatively connected to display data generated by said microprocessor;

a plurality of forward-firing speakers, operatively connected to be controlled by said microprocessor, which radiate acoustic energy toward a user position in front of said display; and one or more rearward-firing speakers, operatively connected to be controlled by said microprocessor, which radiate acoustic energy toward the rear of said display;

wherein the spectral content of said acoustic energy from said rearward-firing speakers is low-pass filtered with a cutoff frequency below 1000 Hz, in order to enhance spatial impression;

wherein said forward-firing speakers and said rearward-firing speakers each may be selectably disabled to match the environment.

15. The system of claim 14, wherein said forward-firing speakers are located in the front side of said display.

16. The system of claim 14, wherein said forward-firing speakers are located in the front portion of a chassis of said computer.

17. The system of claim 14, wherein said rearward-firing speakers are located in the back of said display.

18. The system of claim 14, wherein said rearward-firing speakers are located in the back of a chassis of said computer.

19. The system of claim 14, wherein said rearward-firing speakers are mounted in a side location of a chassis of said computer.

20. The system of claim 14, wherein said forward-firing speakers work in combination with said rearward-firing speakers to enhance said spatial impression.

21. The system of claim 14, wherein equalization is provided to said forward-firing speakers to lower the point of low-end roll-off.

22. The system of claim 14, wherein said rearward-firing speakers radiate an acoustic signal which is delayed in time with respect to energy radiated from said forward-firing speakers.

23. The system of claim 14, wherein the spectral content of said acoustic energy is predominantly below a certain frequency in order to enhance spatial impression.

24. The system of claim 14, wherein said forward-firing and rearward-firing speakers are dynamic speakers.

25. The system of claim 14, wherein said forward-firing and rearward-firing speakers are attached to a monitor external to said portable computer, and positioned to optimize spatial impression.

26. A method of enhancing spatial impression in a portable computer audio sound system, comprising:

(a.) driving first speakers, which are integral with said computer, to radiate acoustic energy toward a user position in front of a planar display; and (b.) driving second speakers, which are integral with said computer, to radiate acoustic energy in a predominant direction more than 60 degrees away from the direction of said first speakers;

wherein said first and said second speakers each may be selectably disabled by a sound cirucit.

27. The method of claim 26, wherein said first speakers are located in the front side of said display.

28. The method of claim 26, wherein said first speakers are located in the front portion of a chassis of said computer.

29. The method of claim 26, wherein said second speakers are located in the back of said display.

30. The method of claim 26, wherein said second speakers are located in the back of a chassis of said computer.

31. The method of claim 26, wherein said second speakers are mounted in a side location of a chassis of said computer.

32. The method of claim 26, wherein said first speakers work in combination with said second speakers to enhance said spatial impression.

33. The method of claim 26, wherein equalization is provided to said first speakers to lower the point of low-end roll-off.

34. The method of claim 26, wherein said second speakers radiate an acoustic signal which is delayed in time with respect to energy radiated from said first speakers.

35. The method of claim 26, wherein the spectral content of said acoustic energy is predominantly below a certain frequency in order to enhance spatial impression.

36. The method of claim 26, wherein said first and second speakers are dynamic speakers.

37. The method of claim 26, wherein said first and second speakers are attached to a monitor external to said portable computer, and positioned to optimize spatial impression.

* * * * *